(12) United States Patent
Chen et al.

(10) Patent No.: US 12,068,584 B2
(45) Date of Patent: Aug. 20, 2024

(54) SEMICONDUCTOR-FIBER-LASER ASSEMBLY AND FIBER LASER

(71) Applicant: BWT Beijing Ltd., Beijing (CN)

(72) Inventors: Xiaohua Chen, Beijing (CN); Weirong Guo, Beijing (CN); Baohua Wang, Beijing (CN)

(73) Assignee: BWT BEIJING LTD., Beijing (CN)

( * ) Notice: Subject to any disclaimer, the term of this patent is extended or adjusted under 35 U.S.C. 154(b) by 697 days.

(21) Appl. No.: 17/288,194

(22) PCT Filed: Dec. 28, 2020

(86) PCT No.: PCT/CN2020/140220
§ 371 (c)(1),
(2) Date: Apr. 23, 2021

(87) PCT Pub. No.: WO2022/140930
PCT Pub. Date: Jul. 7, 2022

(65) Prior Publication Data
US 2022/0399699 A1    Dec. 15, 2022

(51) Int. Cl.
*H01S 5/40*    (2006.01)
*H01S 5/00*    (2006.01)
(Continued)

(52) U.S. Cl.
CPC .......... *H01S 5/4012* (2013.01); *H01S 5/0071* (2013.01); *H01S 5/02251* (2021.01); *H01S 5/02253* (2021.01); *H01S 5/041* (2013.01)

(58) Field of Classification Search
CPC .. H01S 5/4012; H01S 5/0071; H01S 5/02251; H01S 5/02253; H01S 5/041;
(Continued)

(56) References Cited

U.S. PATENT DOCUMENTS 6,132,104 A * 10/2000 Bliss .................. H01S 3/06704
385/53
6,423,963 B1 * 7/2002 Wu ........................ G01J 3/02
359/334
(Continued)

FOREIGN PATENT DOCUMENTS

CN          2650356 Y    10/2004
CN        102891423 A     1/2013
(Continued)

OTHER PUBLICATIONS

First Office Action mailed Sep. 27, 2021 issued in corresponding Chinese Patent Application No. 202011579934.7.
(Continued)

*Primary Examiner* — Vu A Vu
(74) *Attorney, Agent, or Firm* — ARENTFOX SCHIFF LLP

(57) ABSTRACT

A semiconductor-fiber-laser assembly is provided that includes a pumping module, an active optical fiber and an assembling board. The active optical fiber is provided on an upper surface of the assembling board, the pumping module is provided on a surface of the assembling board that is the same as or opposite to the upper surface; and input-side and output-side optical-fiber gratings are provided at two ends of the active optical fiber, to form a laser resonator between the input-side and output-side optical-fiber gratings. The pumping module includes a plurality of semiconductor-laser single emitters, a collimating-lens group and a mirror group that are sequentially arranged, and light beams from the semiconductor-laser single emitters pass through the mirror group to realize beam combination.

10 Claims, 7 Drawing Sheets

(51) Int. Cl.
*H01S 5/02251* (2021.01)
*H01S 5/02253* (2021.01)
*H01S 5/04* (2006.01)

(58) Field of Classification Search
CPC ............... H01S 3/06704; H01S 3/0675; H01S 3/09415; H01S 5/02255; H01S 3/094011
USPC .......................................................... 372/75
See application file for complete search history.

(56) References Cited

U.S. PATENT DOCUMENTS

| | | | |
|---|---|---|---|
| 6,608,949 B2* | 8/2003 | Kim .................... | H01S 3/06791 385/27 |
| 8,027,557 B2* | 9/2011 | Frith ....................... | G02B 6/14 385/124 |
| 8,508,843 B2* | 8/2013 | Murison ............. | H01S 3/06716 359/341.1 |
| 9,001,850 B2* | 4/2015 | Berger .................. | H01S 3/0941 372/6 |
| 9,431,786 B2* | 8/2016 | Savage-Leuchs ............................ | H01S 3/06783 |
| 9,634,462 B2* | 4/2017 | Kliner .................. | C07K 14/705 |
| 10,069,271 B2* | 9/2018 | Kliner ............... | H01S 3/094042 |
| 10,283,939 B2* | 5/2019 | Dawson ............. | H01S 5/02255 |
| 10,739,505 B2* | 8/2020 | Rong .................... | H04B 10/69 |
| 10,763,640 B2* | 9/2020 | Kanskar ................ | H01S 5/4012 |
| 11,594,853 B2* | 2/2023 | Omori ................ | H01S 5/02212 |
| 2006/0133433 A1 | 6/2006 | Alexander | |
| 2009/0225793 A1 | 9/2009 | Marciante et al. | |
| 2016/0291252 A1 | 10/2016 | Kashiwagi et al. | |
| 2018/0019576 A1 | 1/2018 | Guo et al. | |
| 2018/0198251 A1* | 7/2018 | Kanskar ................ | H01S 3/2308 |
| 2019/0199055 A1 | 6/2019 | Lin et al. | |

FOREIGN PATENT DOCUMENTS

| | | |
|---|---|---|
| CN | 104051938 A | 9/2014 |
| CN | 104242024 A | 12/2014 |
| CN | 105849987 A | 8/2016 |
| CN | 105974534 A | 9/2016 |
| CN | 105977771 A | 9/2016 |
| CN | 106129788 A | 11/2016 |
| CN | 206322997 U | 7/2017 |
| CN | 206741106 U | 12/2017 |
| CN | 109103735 A | 12/2018 |
| CN | 109687268 A | 4/2019 |
| CN | 110797737 A | 2/2020 |
| TW | 201929358 A | 7/2019 |

OTHER PUBLICATIONS

Second Office Action mailed Feb. 8, 2022 issued in corresponding Chinese Patent Application No. 202011579934.7.
International Search Report mailed Sep. 28, 2021 issued in corresponding PCT Application No. PCT/CN2020/140220.

* cited by examiner

SEMICONDUCTOR-FIBER-LASER ASSEMBLY AND FIBER LASER

CROSS-REFERENCE TO RELATED APPLICATIONS

This application is a U.S. National Stage entry under 35 U.S.C. § 371 based on International Application No. PCT/CN2020/140220, filed on Dec. 28, 2020, the entire contents of which are hereby incorporated by reference in their entirety.

TECHNICAL FIELD

The present disclosure relates to the technical field of semiconductor fiber lasers, and particularly relates to a semiconductor-fiber-laser assembly and a fiber laser.

BACKGROUND

As shown in FIG. 1(a), a conventional fiber laser is generally provided with a plurality of semiconductor-laser pumping sources, the tail fiber of each of the pumping sources is fusion-welded to a passive optical fiber, the lights of the plurality of pumping sources are combined by optical-fiber beam combination into a passive optical fiber having an optical-fiber grating, then the passive optical fiber is fusion-welded to an active optical fiber, then the active optical fiber is fusion-welded to a passive optical fiber having an optical-fiber grating, and the optical-fiber gratings on the passive optical fibers at the two ends of the active optical fiber form a laser resonator. FIG. 1(b) shows another conventional fiber laser of a GTwave-side pumping structure, which is generally provided with a plurality of semiconductor-laser pumping sources. The tail fiber of each of the pumping sources is fusion-welded to a passive optical fiber. The passive optical fibers of the plurality of pumping sources are combined with an active optical fiber by using the GTwave structure. As shown in FIG. 1(c), the fiber cores of the pumping passive optical fibers and the fiber core of the active optical fiber share a cladding, the pump light gradually transfers into the fiber core of the active optical fiber, the two ends of the active optical fiber is fusion-welded to the passive optical fibers each having an optical-fiber grating, and the optical-fiber gratings on the passive optical fibers at the two ends form a laser resonator.

The above lasers have many optical-fiber fusion-welding points, which results in a complicated process and large size and weight of the device. Each of the fusion-welding points might reduce the efficiency, and increase the risk of damages. Both of the two ends of the active optical fiber are fusion-welded to passive optical fibers each having an optical-fiber grating, which increases the total length of the optical fiber, which might cause nonlinear effect.

SUMMARY

Aiming at the above problems, the present disclosure discloses a semiconductor-fiber-laser assembly and a fiber laser, which employ the mode of laser generation by direct pumping of the active optical fiber in the semiconductor laser (Directly Pumped Fiber Laser, for short DPFL), and eliminates the step of beam combination of pump laser by using passive optical fibers, to overcome the above problems or at least partially solve the above problems.

In order to achieve the above objects, the present disclosure employs the following technical solutions:

An aspect of the present disclosure provides a semiconductor-fiber-laser assembly, wherein the semiconductor-fiber-laser assembly comprises a pumping module, an active optical fiber and an assembling board;

the active optical fiber is provided on an upper surface of the assembling board, the pumping module is provided on a surface of the assembling board that is the same as or opposite to the surface where the active optical fiber is located, the pumping module is provided with a cooling device, and the cooling device cools the active optical fiber via the assembling board;

an input-side optical-fiber grating and an output-side optical-fiber grating are provided at two ends of the active optical fiber, to form a laser resonator between the input-side optical-fiber grating and the output-side optical-fiber grating; and the pumping module comprises a plurality of semiconductor-laser single emitters, a collimating-lens group and a mirror group that are sequentially arranged, and light beams from the semiconductor-laser single emitters pass through the mirror group to realize beam combination.

The pump light from the semiconductor laser of the pumping module is directly spatially coupled into the active optical fiber, thereby pumping the active optical fiber to generate laser, which eliminates the step of beam combination of pump laser by using passive optical fibers.

Optionally, the collimating-lens group is for collimating the light beams emitted from the semiconductor-laser single emitters, and comprises fast-axis collimating lenses and slow-axis collimating lenses, and the quantity of the fast-axis collimating lenses and the quantity of the slow-axis collimating lenses are equal to the quantity of the semiconductor-laser single emitters.

Optionally, the mirror group comprises a plurality of first steering mirrors, and further comprises one second steering mirror and/or a polarizing and beam combining lens, the quantity of the first steering mirrors is equal to the quantity of the semiconductor-laser single emitters, the area of the second steering mirror is greater than the area of each of the first steering mirrors, the light beams emitted from the semiconductor-laser single emitters pass through the first steering mirrors and then form a light-beam stack, and the light-beam stack passes through the second steering mirror and/or the polarization beam combining component, and then is coupled by a coupling lens into a tail fiber of the pumping module.

Optionally, a tail fiber of the pumping module is a double-clad fiber, the value range of the core diameter of the tail fiber is 250-800 μm, and its numerical aperture is 0.2-0.46.

Optionally, the active optical fiber is the double-clad fiber, and is doped with $Yb^{3+}$ and/or $Er^{3+}$, the diameter of the fiber core is 14-20 μm, the numerical aperture between the fiber core and the inner cladding is 0.04-0.08, the external diameter of the inner cladding is 200-400 μm, and the numerical aperture between the inner cladding and the outer cladding is 0.4-0.6.

Optionally, the active optical fiber is fusion-welded to a tail fiber of the pumping module, and/or, an output end of the active optical fiber is provided with an end cap.

Optionally, the housing of the pumping module and/or the assembling board are/is made of a light-weight alloy material, and the assembling board is provided with an optical-fiber fixing groove, an optical-fiber coiling groove or an optical-fiber coiling column.

Optionally, the pumping module is provided with an indicator-light source, and an indicator light emitted from the indicator-light source is coupled into a tail fiber of the pumping module.

Optionally, the indicator-light source is fixed to the housing of the pumping module by any one of the following modes:

the indicator-light source is fixed within the housing of the pumping module;

the indicator-light source is disposed outside the housing of the pumping module, the housing is provided with a through hole, and an optical fiber of the indicator-light source or an indicator-light inputting optical fiber that is fusion-welded to an optical fiber of the indicator-light source passes through the through hole and communicates with the interior of the housing; or the indicator-light source is disposed outside the housing of the pumping module, the housing is provided with an indicator-light adapter, and an end cap of the indicator-light source is mounted and fixed to the indicator-light adapter; and the indicator light emitted from the indicator-light source passes through an indicator-light collimating lens, the second steering mirror and the coupling lens and then enters the tail fiber of the pumping module.

Another aspect of the present disclosure further provides a fiber laser, wherein the fiber laser comprises a plurality of semiconductor-fiber-laser assemblies described above, and lasers outputted from the active optical fibers of the semiconductor-fiber-laser assemblies are combined by optical-fiber beam combination and inputted into a multimode optical fiber.

By using the above technical solutions, the advantages and advantageous effects of the present disclosure are as follows.

The present disclosure provides a miniaturized, light-weighted, directly pumped kilowatt-scale full-optical-fiber laser, which has the advantages of good integration, modularization and light weighting.

The spatial beam combination of the light beams emitted from the plurality of semiconductor-laser single emitters by using the steering mirrors does not require a stepped plate, which enables the pumping module to have a compact structure and a light weight.

The water-cooling bottom plate in the cooling device and the housing of the pumping module are made of a light-weighted alloy to further reduce the weight.

After the adjusting of the optical path in the pumping module has been completed, it may be added the housing to form a closed space. Therefore, the interior of the pumping module is not influenced by the subsequent installation process, which improves the stability of the system.

Because the optical-fiber gratings are on the active optical fiber, it is not required to fusion-weld passive optical fibers having optical-fiber gratings at the two ends of the active optical fiber. Therefore, the length of the optical fiber according to the present disclosure can be shorter, to reduce the nonlinear effect.

The lasers outputted from the plurality of active optical fibers may be combined by optical-fiber beam combination and inputted into a multimode optical fiber, to further expand the power. As compared with the prior art, by using the structure according to the present disclosure as the unit for optical-fiber beam combination, high-power laser output can be realized with a lesser device size.

The structure according to the present disclosure can integrate the indicator light, and the optical-fiber beam combination does not require an additional indicator light, and does not require N+1 beam combination. The built-in indicator-light structure has a good integration level, the fusion-welded indicator-light structure has good stability and reliability, and the plug-in indicator-light structure facilitates the replacing of the indicator-light source in maintenance.

BRIEF DESCRIPTION OF THE DRAWINGS

By reading the following detailed description of the preferable embodiments, various other advantages and benefits will become clear to a person skilled in the art. The drawings are merely intended to show the preferable embodiments, and are not to be considered as limiting the present disclosure. Furthermore, throughout the drawings, the same reference signs denote the same elements. In the drawings.

Figure 1A:
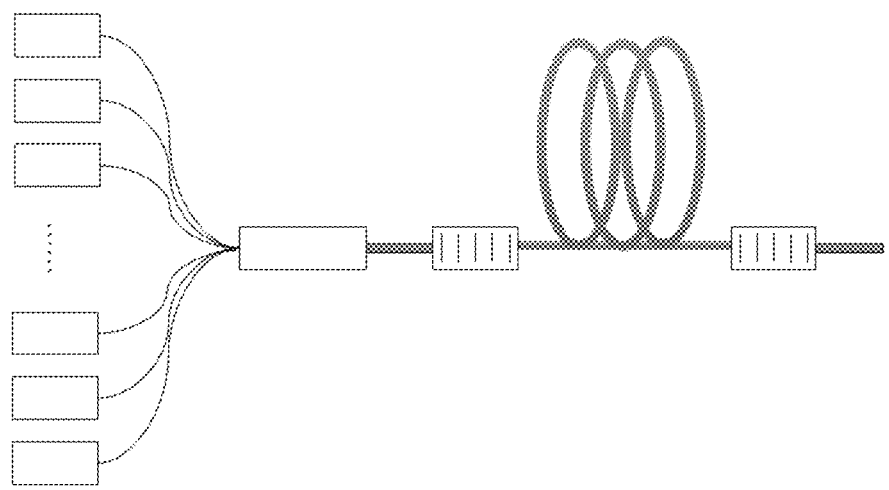
FIG. 1(a) is a schematic structural diagram of a fiber laser that pumps by optical-fiber beam combination in the prior art.
Figure 1B:
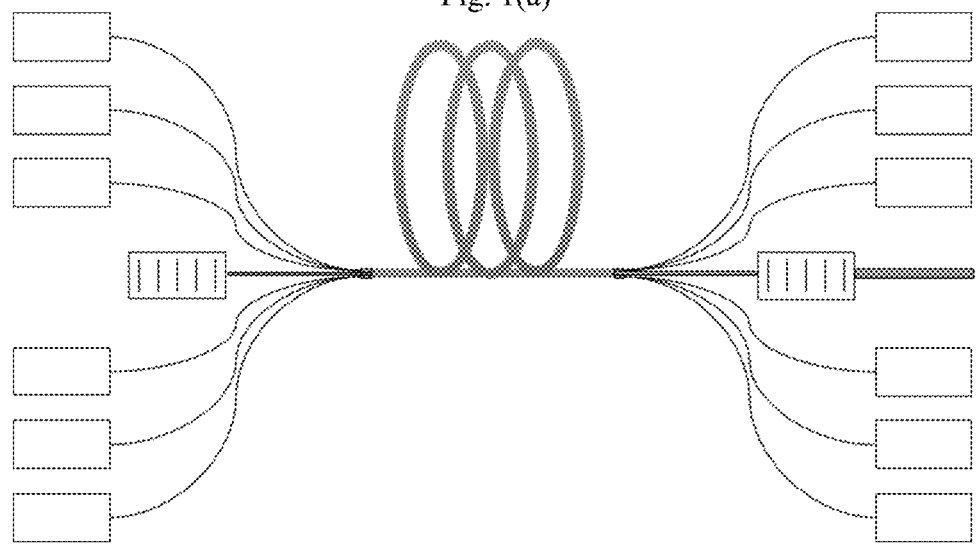
FIG. 1(b) is a schematic structural diagram of a fiber laser of a GTwave-side pumping structure in the prior art.
Figure 1C:
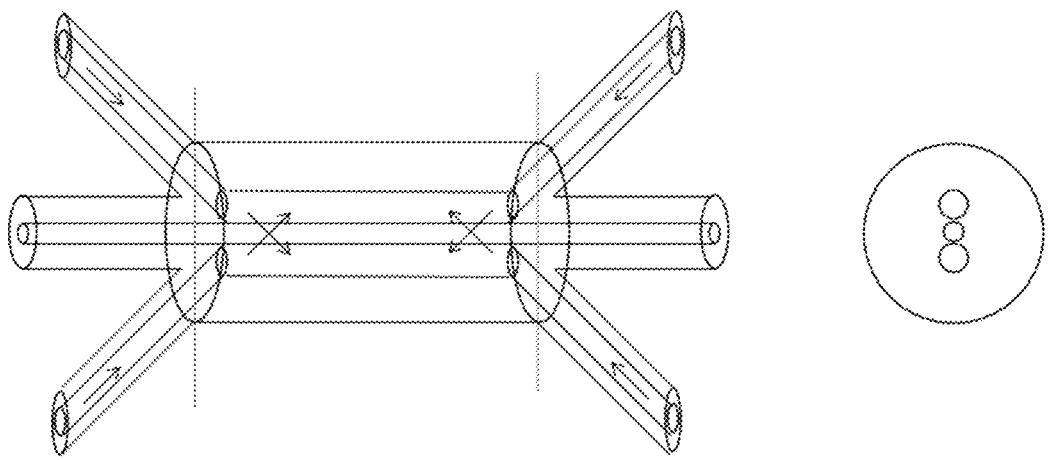
FIG. 1(c) is a schematic structural diagram of the fusion welding between the pumping passive optical fibers and the active optical fiber in FIG. 1(b)

In the drawings: 1 is the pumping module, 1.1 is the semiconductor-laser single emitters, 1.2 is the pump light beams, 1.3 is the fast-axis collimating lenses, 1.4 is the slow-axis collimating lenses, 1.5 is the first steering mirrors, 1.6 is the second steering mirror, 1.7 is the coupling lens, 1.8 is the tail fiber, 1.9 is the housing of the pumping module, 1.10 is the indicator-light source, 1.11 is the indicator-light beam, 1.12 is the indicator-light collimating lens, 1.13 is the indicator-light source having an optical fiber, 1.14 is the indicator-light inputting optical fiber, 1.15 is the fusion-welding point of the indicator light, 1.16 is the indicator-light source having an optical fiber and an end cap, 1.17 is the indicator-light adapter, 2 is the assembling board, 3 is the driving and controlling module, 4 is the active optical fiber, 4.1 is the input-side optical-fiber grating, and 4.2 is the output-side optical-fiber grating.

DETAILED DESCRIPTION

In order to make the objects, the technical solutions and the advantages of the present disclosure clearer, the technical solutions of the present disclosure will be clearly and completely described below with reference to the particular embodiments and the corresponding drawings of the present disclosure. Apparently, the described embodiments are merely certain embodiments of the present disclosure, rather than all of the embodiments. All of the other embodiments that a person skilled in the art can obtain on the basis of the embodiments in the present disclosure without paying creative work will fall within the protection scope of the present disclosure.

It should be understood that the terms "include/comprise", "consist of" or any variants thereof are intended to cover non-exclusive inclusions, so that products, devices, processes or methods that include a series of elements do not only include those elements, but may also, when required, include other elements that are not explicitly listed, or include the elements that are inherent of such products, devices, processes or methods. Unless further limitation is set forth, an element defined by the wording "include/comprise" and "consist of" does not exclude additional same element in the products, devices, processes or methods comprising the element.

It should also be understood that the terms that indicate orientation or position relations, such as "upper", "lower", "front", "rear", "left", "right", "top", "bottom", "inner" and "outer", are based on the orientation or position relations shown in the drawings, and are merely for conveniently describing the present disclosure and simplifying the description, rather than indicating or implying that the device, element or structure must have the specific orientation and be constructed or operated according to the specific orientation. They should not be construed as a limitation on the present disclosure.

In the present disclosure, unless explicitly defined or limited otherwise, the terms "mount", "connect", "link" and "fix" should be interpreted broadly. For example, it may be fixed connection, detachable connection, or integral connection; it may be mechanical connection or electrical connection; and it may be direct connection or indirect connection by an intermediate medium, and may be the internal communication between two elements or the interaction between two elements. A person skilled in the art can determine the particular meaning of the terms in the present disclosure concretely.

The technical solutions provided by the embodiments of the present disclosure will be described in detail below with reference to the drawings.

Figure 2:
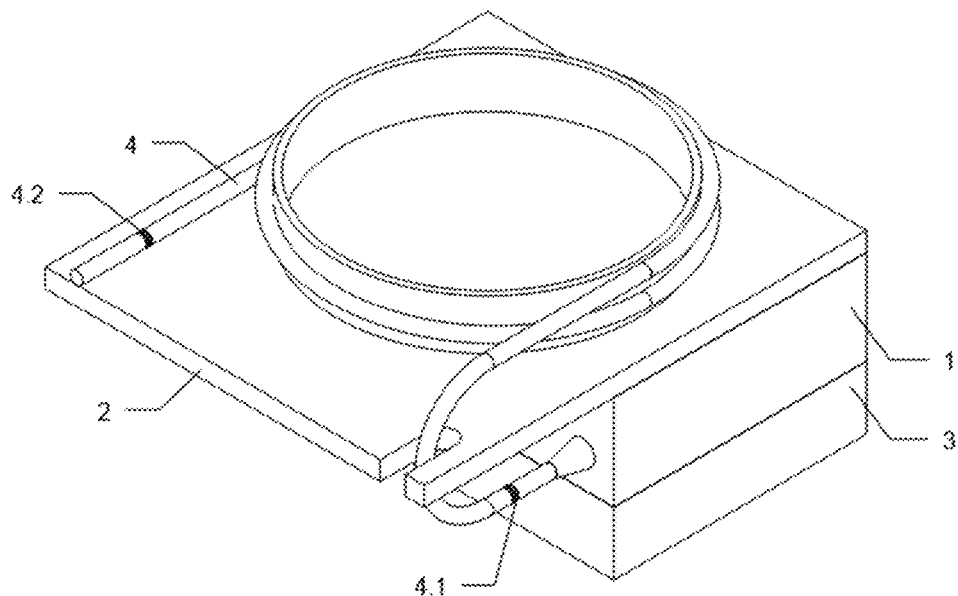
FIG. 2 is a schematic front view of the modularized fiber-laser assembly according to an embodiment of the present disclosure.

FIG. 2 illustrates the particular structure of a modularized semiconductor-fiber-laser assembly. The semiconductor-fiber-laser assembly comprises a light-weighted semiconductor-laser pumping module 1, an assembling board 2, a pumping driving and controlling module 3 and an active optical fiber 4. The pumping driving and controlling module 3 is configured to realize the driving and controlling on the pumping module 1, and is provided inside or on the housing of the pumping module 1.

The above laser of the novel structure, by using the mode of laser generation by direct pumping of the active optical fiber in the semiconductor laser (DPFL), eliminates the step of beam combination of pumping laser by using passive optical fibers.

Figure 3:
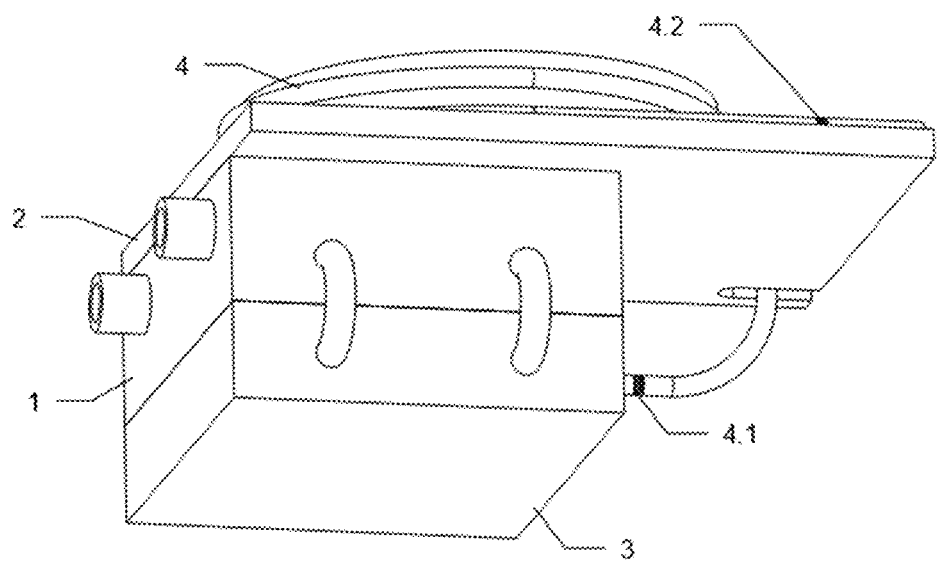
FIG. 3 is a schematic bottom view of the modularized fiber-laser assembly according to an embodiment of the present disclosure.
Figure 4:
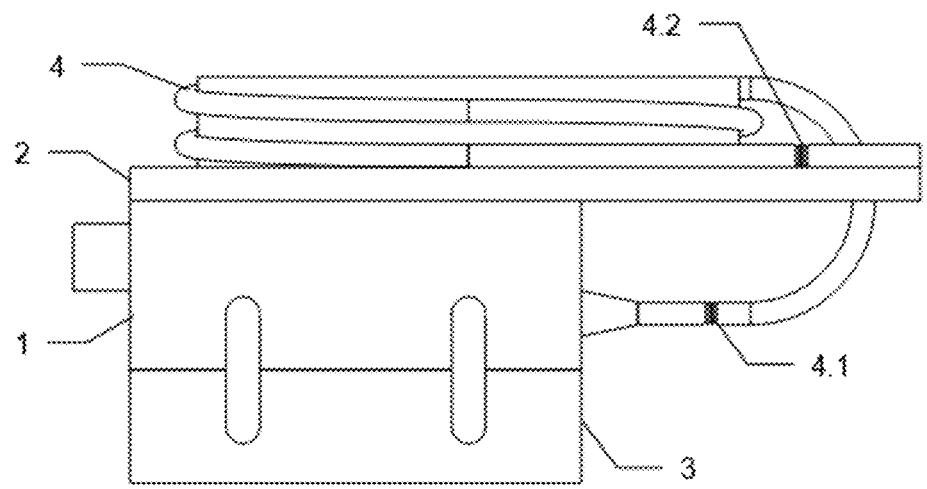
FIG. 4 is a schematic side view of the modularized fiber-laser assembly according to an embodiment of the present disclosure.
Figure 7:
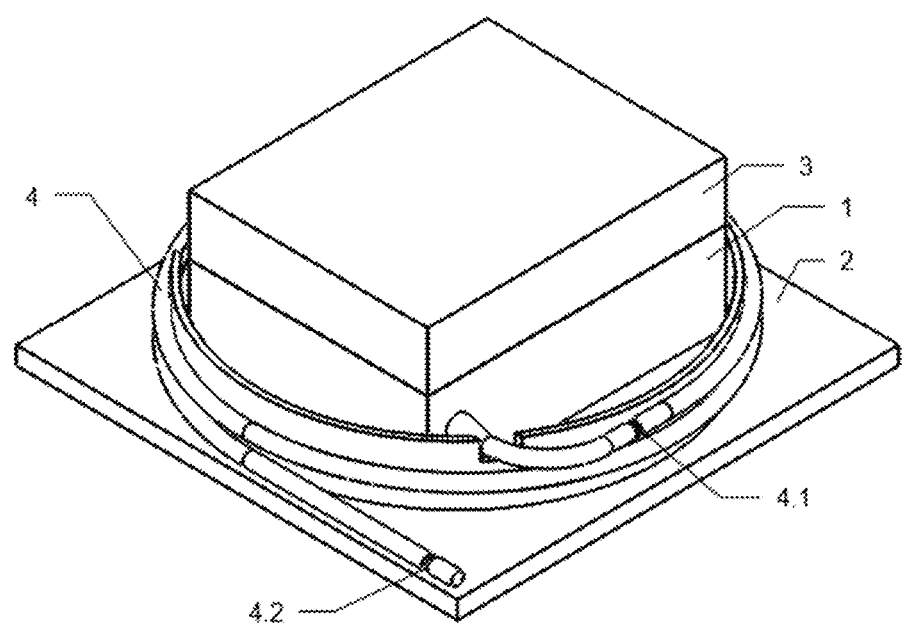
FIG. 7 is a schematic front view of the modularized fiber-laser assembly according to another embodiment of the present disclosure.
Figure 8:
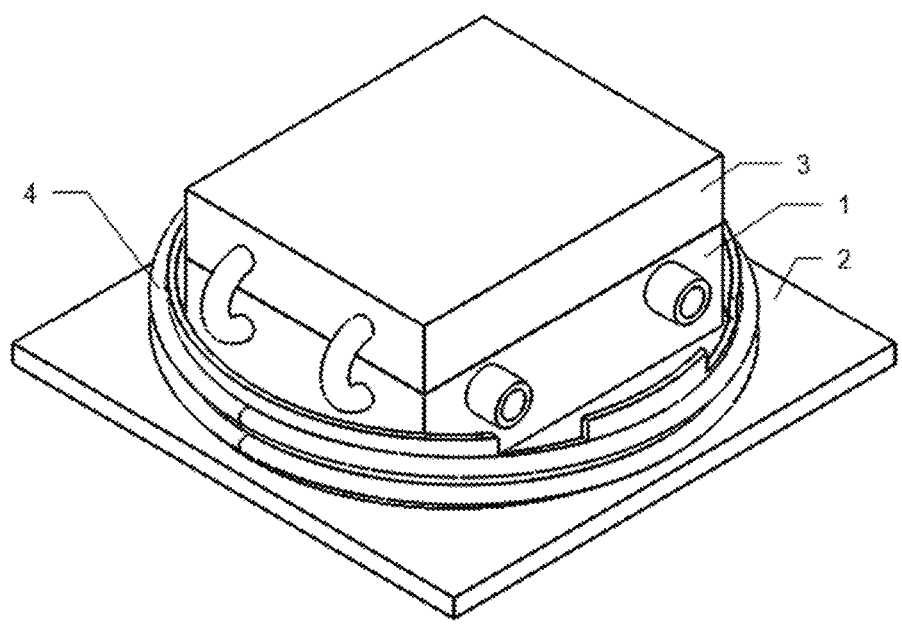
FIG. 8 is a schematic back view of the assembling board of the modularized fiber laser according to another embodiment of the present disclosure.

Further, referring to FIGS. 2-4, the active optical fiber 4 is fixed to the upper surface of the assembling board 2. The pumping module 1 and the pumping driving and controlling module 3 are disposed inside the same housing, and the housing is disposed on the lower surface of the assembling board 2. FIGS. 7-8 show schematic diagrams in which the pumping module 1, the pumping driving and controlling module 3 and the active optical fiber 4 are disposed on the same surface of the assembling board 2.

Figure 5:
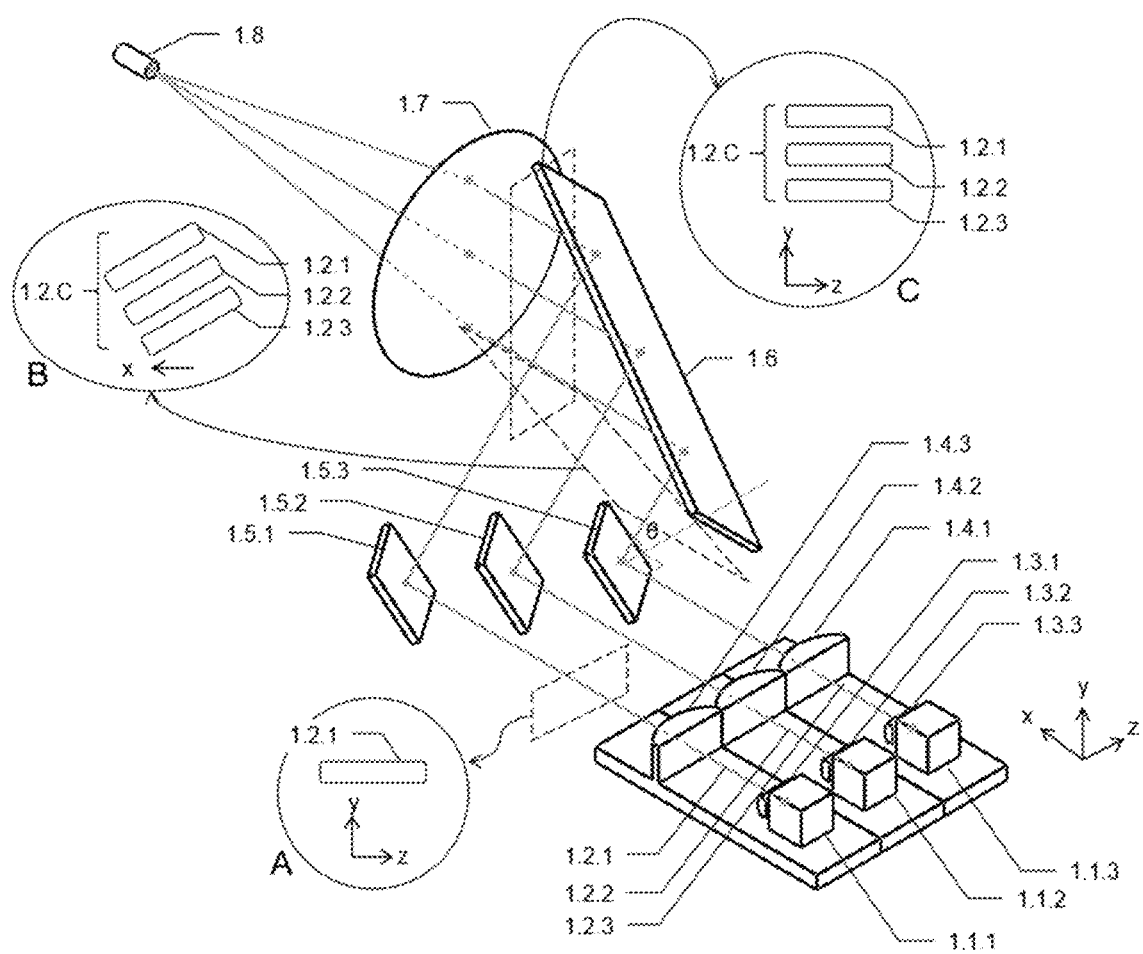
FIG. 5 is a schematic view of the optical path of the pumping module according to an embodiment of the present disclosure.
Figure 6:
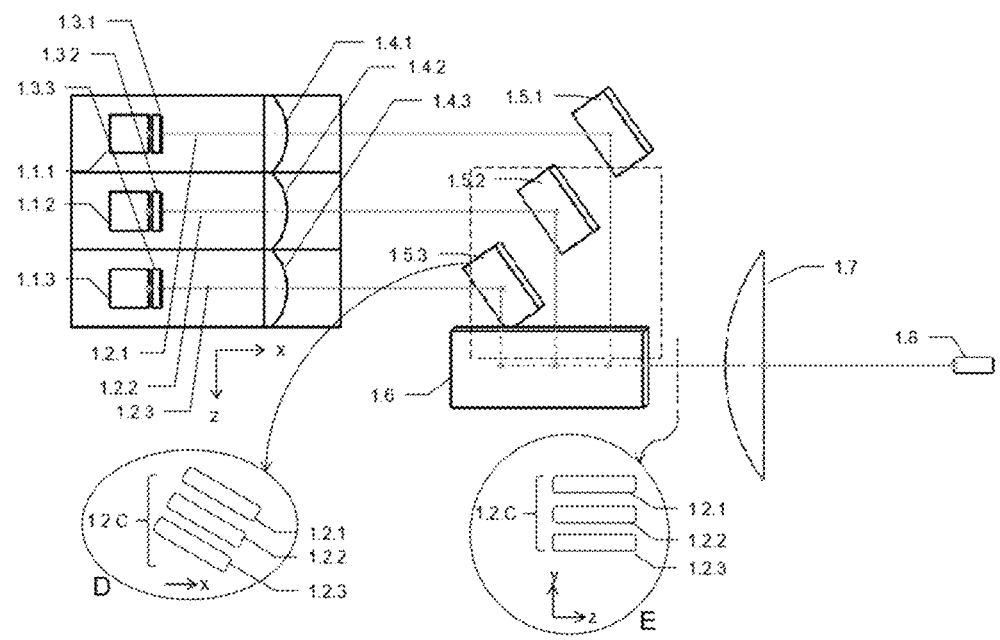
FIG. 6 is a top view of the optical path of the pumping module according to an embodiment of the present disclosure.

As shown in FIGS. 5 and 6, a plurality of semiconductor-laser single emitters 1.1 in the pumping module 1 perform beam combination by using inclined first steering mirrors 1.5 and a second steering mirror 1.6. The optical power outputted from each of the semiconductor-laser single emitters 1.1 is 20-50 W. The light beam 1.2 emitted from each of the semiconductor-laser single emitters 1.1 is collimated by corresponding fast-axis collimating lens 1.3 and slow-axis collimating lens 1.4, and is then reflected by a corresponding first steering mirror 1.5. The light beams 1.2 emitted from the plurality of semiconductor-laser single emitters 1.1 are reflected by the first steering mirrors 1.5, and are combined into a light-beam stack 1.2.C. The light-beam stack 1.2.C is reflected by the second steering mirror 1.6, and is coupled by a coupling lens 1.7 into a tail fiber 1.8 of the pumping module 1. The tail fiber 1.8 is fusion-welded to the active optical fiber 4.

An input-side optical-fiber grating 4.1 is provided at one end of the active optical fiber 4 that is fusion-welded to the tail fiber 1.8 of the pumping module 1, and can totally reflect laser and transmit pump light. An output-side optical-fiber grating 4.2 is provided at the output end of the active optical fiber 4, and can partially reflect laser. Therefore, a laser resonator is formed between the two optical-fiber gratings 4.1 and 4.2. Because the optical-fiber gratings 4.1 and 4.2 are on the active optical fiber 4, it is not required to fusion-weld passive optical fibers having optical-fiber gratings at the two ends of the active optical fiber. Therefore, the length of the optical fiber according to the present disclosure can be shorter, to reduce the nonlinear effect.

Optionally, the light-beam stack 1.2.C that is combined after being reflected by the first steering mirrors 1.5 may be further combined by a polarization beam combining component, and then coupled by the coupling lens 1.7 into the tail fiber 1.8.

The tail fiber 1.8 of the pumping module 1 is a double-clad fiber, the diameter of the core of the double cladding is 250-800 µm, and the numerical aperture NA is 0.2-0.46.

The spatial beam combination of the light beams emitted from the plurality of semiconductor-laser single emitters 1.1 by using the steering mirrors 1.5 and 1.6 does not require a stepped plate, which enables the pumping module 1 to have a compact structure and a light weight, thereby realizing the integration, modularization and light weighting of the fiber-laser assembly.

Furthermore, the cooling component of the pumping module 1, such as a water-cooling bottom plate, and other parts of the housing are made of a light-weighted alloy such as aluminum alloy to further reduce the weight. Preferably, the assembling board 2 contacts one side of the pumping module 1 that has a cooling device such as a water-cooling means, thereby enabling the water-cooling means of the pumping module 1 to cool the active optical fiber 4 via the assembling board 2 while cooling the pumping module 1.

After the adjusting of the optical path in the pumping module 1 has been completed, it is added the housing to form a closed space, so the interior of the pumping module 1 is not influenced by the subsequent installation process, which further improves the stability of the assembly.

Referring to FIGS. 2-4, the assembling board 2 may be provided with structures such as an optical-fiber fixing groove, an optical-fiber coiling groove or an optical-fiber coiling column to fix the active optical fiber and improve the cooling of the active optical fiber.

Preferably, the output end of the active optical fiber 4 is provided with an end cap.

Figure 9:
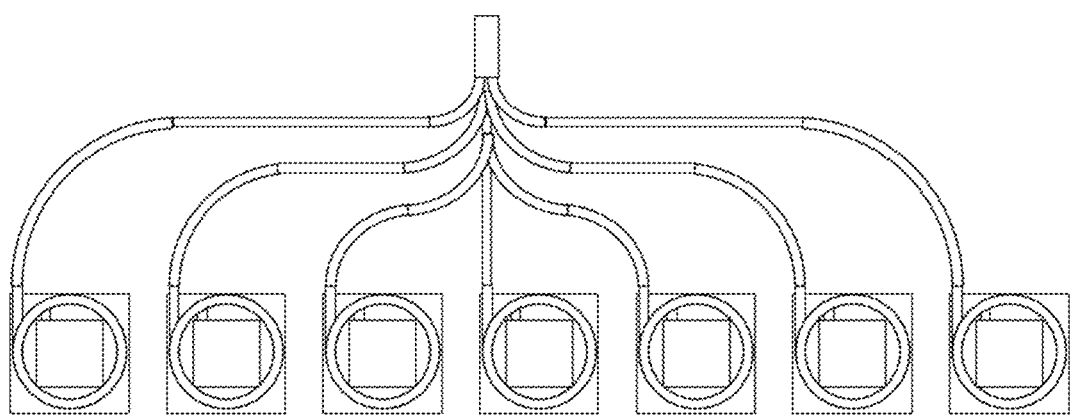
FIG. 9 is a schematic diagram of the optical-fiber beam combination of the fiber laser according to an embodiment of the present disclosure.

As shown in FIG. 9, the fiber laser may comprise a plurality of fiber-laser assemblies, and the lasers outputted from the plurality of active optical fibers 4 are combined by optical-fiber beam combination and inputted into a multi-mode optical fiber, to further expand the power.

As compared with the prior art, by using the fiber laser according to the present disclosure as a unit for optical-fiber beam combination, high-power laser output can be realized with a smaller device size.

Further, the semiconductor-fiber-laser assembly may also integrate the indicator light, and the optical-fiber beam combination does not require an additional indicator light, and does not require N+1 beam combination. As examples, the present disclosure provides three embodiments.

Figure 10:
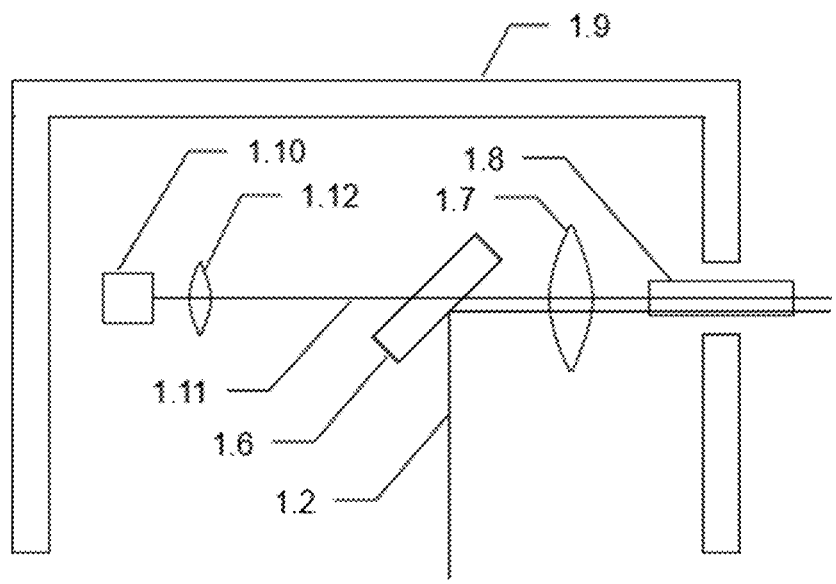
FIG. 10 is a schematic structural diagram of the built-in indicator-light according to an embodiment of the present disclosure.

Referring to FIG. 10, a built-in indicator-light structure may be employed. An indicator-light source 1.10 of the visible wavelength range is provided inside the housing 1.9 of the pumping module 1, and then the indicator light 1.11 is coupled into the tail fiber 1.8 of the pumping module 1. The built-in indicator-light structure has a good integration level.

Figure 11:
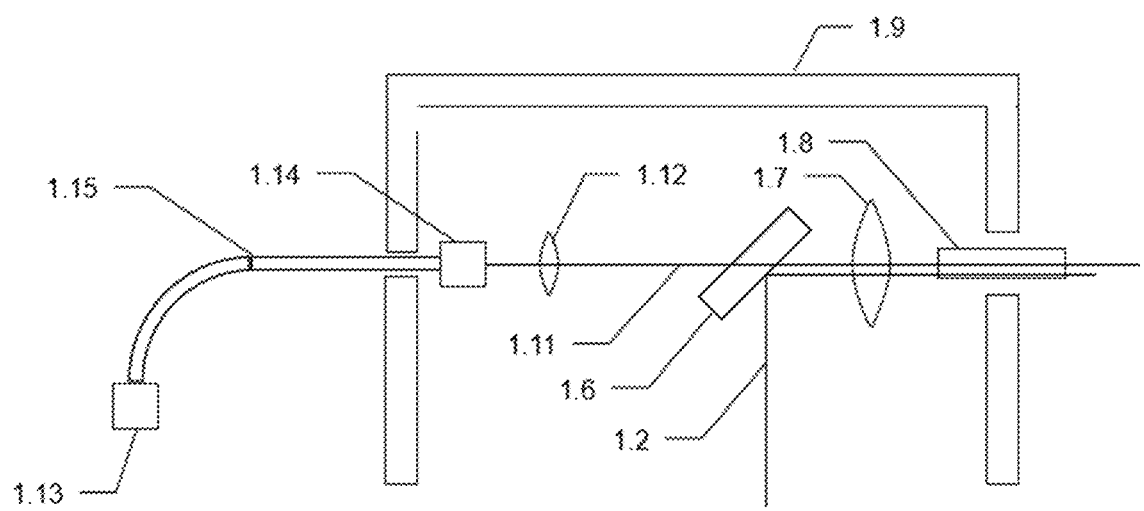
FIG. 11 is a schematic structural diagram of the fusion-welded indicator-light according to an embodiment of the present disclosure.

Optionally, as shown in FIG. 11, a fusion-welded indicator-light structure may be employed. An indicator-light inputting optical fiber 1.14 protrudes out of the housing 1.9 of the pumping module 1, the optical fiber of the indicator-light source 1.13 having an optical fiber is fusion-welded to the indicator-light inputting optical fiber 1.14, and then the indicator light 1.11 outputted from the output end of the indicator-light inputting optical fiber 1.14 is coupled into the tail fiber 1.8 of the pumping module 1. The fusion-welded indicator-light structure has good stability and reliability.

Figure 12:
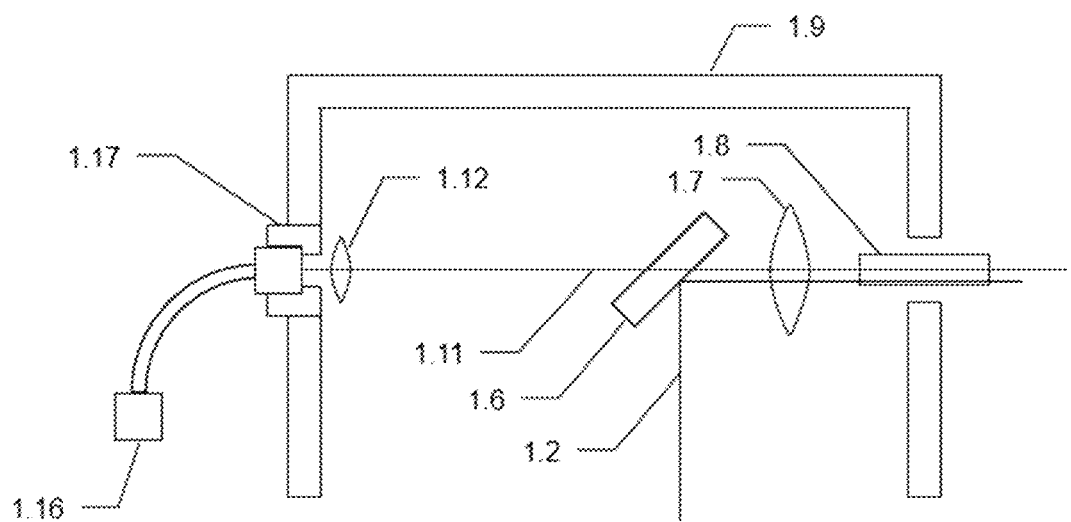
FIG. 12 is a schematic structural diagram of the plug-in indicator-light according to an embodiment of the present disclosure.

Optionally, as shown in FIG. 12, a plug-in indicator-light structure may be employed. An indicator-light adapter 1.17 is provided at the housing 1.9 of the pumping module 1, the end cap of the indicator-light source 1.16 having an optical fiber and an end cap is mounted and fixed to the indicator-light adapter 1.17, and then the indicator light 1.11 is coupled into the tail fiber 1.8 of the pumping module 1. The plug-in indicator-light structure facilitates to replace the indicator-light source 1.16 in maintenance.

The fiber laser according to the present disclosure has the characteristics of good modularization and integration, and can reduce the size and the weight of the device.

The above embodiments will be further explained by using the following three particular embodiments:

The First Embodiment

The pumping module 1 has one array comprising 22 semiconductor-laser single emitters 1.1, wherein each of the single emitters has an output power of 35 W and a wavelength of 976 nm.

As shown in the inset A in FIG. 5, the light beam 1.2 exiting from a monotube propagates in the x-axis direction, wherein the slow-axis direction is the z-axis direction, and the fast-axis direction is the y-axis direction. The light beam 1.2 of each of the single emitters 1.1 is collimated by corresponding fast-axis collimating lens 1.3 and slow-axis collimating lens 1.4, and is then reflected by a corresponding first steering mirror 1.5.

The propagation direction of the light beams 1.2 that have been reflected by the first steering mirrors 1.5 is in a plane parallel to the y-z plane. As shown in the inset B in FIG. 5, in a cross section perpendicular to the propagation direction of the light beams 1.2, the light beams 1.2 form a stack 1.2.C.

The light-beam stack 1.2.C, after being reflected by the second steering mirror 1.6, propagates in the x-axis direction. As shown in the inset C in FIG. 5, in a cross section perpendicular to the propagation direction of the light beams, the slow-axis direction of the light-beam stack 1.2.C is the z-axis direction, and the fast-axis direction is the y-axis direction.

The coupling lens 1.7 couples the light-beam stack 1.2.C into the tail fiber 1.8.

The pumping module 1 can provide a pump-light power of >750 W.

The active optical fiber 4 is doped with $Yb^{3+}$ or $Er^{3+}$, the active optical fiber 4 has a double cladding, the fiber-core diameter is 14 μm, and the NA between the fiber core and the inner cladding is 0.06. The diameter of the inner cladding is 200 μm, and the NA between the inner cladding and the outer cladding is 0.46.

The output end of the optical fiber is added a QBH end cap. The optical-fiber grating at one end of the tail fiber of the pumping module 1 that is fusion-welded is transmittable to the wavelength of 976 nm, and is of total reflection to the wavelength of 1064 nm. The optical-fiber grating at the output end can partially reflect the wavelength of 1064 nm.

Accordingly, the fiber laser can output a laser power of >500 W.

The Second Embodiment

The pumping module 1 employs semiconductor-laser single emitters 1.1 similar to those of the first embodiment, and comprises two arrays each of which comprising 22 semiconductor-laser single emitters 1.1.

Each line of the arrays comprises 10 semiconductor-laser single emitters 1.1, the mode of the beam combination of which is the same as that of the first embodiment. The light-beam stacks 1.2.C of the two arrays are polarization combined, and then coupled into the tail fiber 1.8.

The pumping module 1 can provide a pump-light power of >1500 W.

The active optical fiber 4 is similar to that of the first embodiment, and the difference is that the fiber-core diameter is 20 μm, and the diameter of the inner cladding is 400 μm.

The fiber laser can output a laser power of >1000 W.

The Third Embodiment

As shown in FIGS. 7 and 8, the difference from the first embodiment is that the pumping module 1, the driving and controlling module 3 and the active optical fiber 4 are fixed to the same surface of the assembling board 2.

The above are merely embodiments of the present disclosure, and are not limiting the protection scope of the present disclosure. Any modifications, equivalent substitutions, improvements and extensions that are made within the spirit and principle of the present disclosure should fall within the protection scope of the present disclosure.

The invention claimed is:

1. A semiconductor-fiber-laser assembly, comprising:
a pumping module, an active optical fiber and an assembling board;
wherein the active optical fiber is provided on an upper surface of the assembling board, the pumping module is provided on a surface of the assembling board that is the same as or opposite to a surface where the active optical fiber is located, the pumping module includes a cooling device configured to cool the active optical fiber via the assembling board,
wherein an input-side optical-fiber grating and an output-side optical-fiber grating are provided at two ends of the active optical fiber, to form a laser resonator between the input-side optical-fiber grating and the output-side optical-fiber grating,
wherein the pumping module comprises a plurality of semiconductor-laser single emitters, a collimating-lens group and a mirror group that are sequentially arranged, and light beams from the semiconductor-laser single emitters pass through the reflecting-mirror group to realize beam combination,
wherein the mirror group comprises a plurality of first steering mirrors respectively corresponding to the plurality of semiconductor-laser single emitters and that are configured to reflect the light beams of the semiconductor-laser single emitters in a cross-section perpendicular to a propagation direction of the light beams and a propagation direction of the reflected light beams are inclined upwards relative to the assembling board, which is a plane, and
wherein the mirror group further comprises a second steering mirror and/or a polarization beam combining component, the light beams emitted from the semiconductor-laser single emitters pass through the first steering mirrors and then form a single light-beam stack that passes through the second steering mirror and/or the polarization beam combining component, and then is coupled by a coupling lens into a tail fiber of the pumping module.

2. The assembly according to claim 1, wherein the collimating-lens group is for collimating the light beams emitted from the semiconductor-laser single emitters, and comprises fast-axis collimating lenses and slow-axis collimating lenses, and the quantity of the fast-axis collimating lenses and the quantity of the slow-axis collimating lenses are equal to the quantity of the semiconductor-laser single emitters.

3. The assembly according to claim 1, wherein the area of the second steering mirror is greater than the area of each of the first steering and reflecting mirrors.

4. The assembly according to claim 1, wherein a tail fiber of the pumping module is a double-clad fiber, the value range of a core diameter of the tail fiber is 250-800 μm, its numerical aperture is 0.2-0.46, and the active optical fiber is fusion-welded to a tail fiber of the pumping module.

5. The assembly according to claim 1, wherein the active optical fiber is a double-clad fiber, and is doped with $Yb^{3+}$ and/or $Er^{3+}$, the diameter of the fiber core is 14-20 μm, the numerical aperture between the fiber core and an inner cladding is 0.04-0.08, the external diameter of the inner cladding is 200-400 μm, and the numerical aperture between the inner cladding and the outer cladding is 0.4-0.6.

6. The assembly according to claim 1, wherein the active optical fiber is fusion-welded to a tail fiber of the pumping module, and/or, an output end of the active optical fiber is provided with an end cap.

7. The assembly according to claim 1, wherein the housing of the pumping module and/or the assembling board are/is made of a light-weight alloy material, and the assembling board is provided with an optical-fiber fixing groove, an optical-fiber coiling groove or an optical-fiber coiling column.

8. The assembly according to claim 1, wherein the pumping module is provided with an indicator-light source, and the indicator light emitted from the indicator-light source is coupled into a tail fiber of the pumping module.

9. The assembly according to claim 8, wherein the indicator-light source is fixed to the housing of the pumping module by any one of the following modes:
the indicator-light source is fixed within the housing of the pumping module;
the indicator-light source is disposed outside the housing of the pumping module, the housing is provided with a through hole, and an optical fiber of the indicator-light source or an indicator-light inputting optical fiber that is fusion-welded to an optical fiber of the indicator-light source passes through the through hole and communicates with the interior of the housing; or
the indicator-light source is disposed outside the housing of the pumping module, the housing is provided with an indicator-light adapter, and an end cap of the indicator-light source is mounted and fixed to the indicator-light adapter; and
the indicator light emitted from the indicator-light source passes through an indicator-light collimating lens, the second steering mirror and the coupling lens and then enters the tail fiber of the pumping module.

10. A fiber laser comprising:
a plurality of semiconductor-fiber-laser assemblies; and
lasers outputted from active optical fibers of the semiconductor-fiber-laser assemblies that are combined by optical-fiber beam combination and inputted into a multimode optical fiber,
wherein the semiconductor-fiber-laser assembly comprises a pumping module, an active optical fiber and an assembling board,
wherein the active optical fiber is provided on an upper surface of the assembling board, the pumping module is provided on a surface of the assembling board that is the same as or opposite to a surface where the active optical fiber is located, the pumping module includes a cooling device that is configured to cool the active optical fiber via the assembling board,
wherein an input-side optical-fiber grating and an output-side optical-fiber grating are provided at two ends of the active optical fiber, to form a laser resonator between the input-side optical-fiber grating and the output-side optical-fiber grating,
wherein the pumping module comprises a plurality of semiconductor-laser single emitters, a collimating-lens group and a mirror group that are sequentially arranged, and light beams from the semiconductor-laser single emitters pass through the mirror group to realize a beam combination,
wherein the mirror group comprises a plurality of first steering mirrors respectively corresponding to the plurality of semiconductor-laser single emitters and that are configured to reflect the light beams of the semiconductor-laser single emitters in a cross-section perpendicular to a propagation direction of the light beams and a propagation direction of the reflected light beams are inclined upwards relative to the assembling board, which is a plane, and wherein the mirror group further comprises a second steering mirror and/or a polarization beam combining component, the light beams emitted from the semiconductor-laser single emitters pass through the first steering mirrors and then form a single light-beam stack that passes through the second steering mirror and/or the polarization beam combining component, and then is coupled by a coupling lens into a tail fiber of the pumping module.

* * * * *